United States Patent [19]

Burkhart et al.

[11] Patent Number: 5,656,093
[45] Date of Patent: Aug. 12, 1997

[54] WAFER SPACING MASK FOR A SUBSTRATE SUPPORT CHUCK AND METHOD OF FABRICATING SAME

[75] Inventors: Vincent E. Burkhart, San Jose; Michael N. Sugarman, San Francisco; Howard E. Grunes, Santa Cruz, all of Calif.

[73] Assignee: Applied Materials, Inc., Santa Clara, Calif.

[21] Appl. No.: 612,652

[22] Filed: Mar. 8, 1996

[51] Int. Cl.$^6$ .................. C23C 16/00; C23C 14/50
[52] U.S. Cl. ............ 118/728; 204/298.15; 156/345; 279/128; 361/234; 118/500; 118/503; 118/504; 269/903
[58] Field of Search .................. 118/728, 500, 118/503, 504; 156/345; 279/128; 361/234; 204/298.15; 269/21, 903

[56] References Cited

U.S. PATENT DOCUMENTS

| | | | |
|---|---|---|---|
| 4,184,188 | 1/1980 | Briglia | 361/234 |
| 4,361,643 | 11/1982 | Banks | 430/396 |
| 4,384,918 | 5/1983 | Abe | 156/643 |
| 4,502,094 | 2/1985 | Lewin | 361/234 |
| 4,599,970 | 7/1986 | Peterson | 118/504 |
| 4,603,466 | 8/1986 | Morley | 29/569 R |
| 5,117,121 | 5/1992 | Watanabe et al. | 307/130 |
| 5,192,371 | 3/1993 | Shuto | 118/728 |
| 5,376,180 | 12/1994 | Mahler | 118/728 |
| 5,382,311 | 1/1995 | Ishikawa | 156/345 |
| 5,447,595 | 9/1995 | Nakagawa | 156/345 |
| 5,456,756 | 10/1995 | Ramaswami | 118/721 |
| 5,463,526 | 10/1995 | Mundt | 361/234 |
| 5,474,614 | 12/1995 | Robbins | 361/234 |
| 5,528,451 | 6/1996 | Su | 361/234 |
| 5,530,616 | 6/1996 | Kitabayashi | 361/234 |
| 5,531,835 | 7/1996 | Fodor | 118/728 |
| 5,560,780 | 10/1996 | Wu | 118/728 |
| 5,583,736 | 12/1996 | Anderson | 361/234 |

FOREIGN PATENT DOCUMENTS

| | | | |
|---|---|---|---|
| 0452222A1 | 10/1991 | European Pat. Off. | H01L 21/00 |
| 60-261377 | 12/1985 | Japan | H02N 13/00 |
| 63-150918 | 6/1988 | Japan . | |
| 63-194345 | 8/1988 | Japan | H01L 21/68 |
| 7-18438 | 1/1995 | Japan | C23C 14/50 |
| 2050064 | 12/1980 | United Kingdom . | |

OTHER PUBLICATIONS

Watanabe et al., "Electrostati Force and Absorption Current of Alumina Electrostatic Chuck", Jpn. J. Appl. Phys., vol. 31, No. 7, pp. 2145–2150, Jul. 1992.

Primary Examiner—Richard Bueker
Assistant Examiner—Jeffrie R. Lund
Attorney, Agent, or Firm—Thomason & Moser

[57] ABSTRACT

A wafer spacing mask for supporting a workpiece in a spaced apart relation to a workpiece support chuck. More specifically, the wafer spacing mask contains a plurality of metallic support members deposited upon the support surface of the chuck. The support members maintain a wafer, or other workpiece, in a spaced apart relation to the support surface of the chuck. The distance between the underside surface of the wafer and the chuck is defined by the thickness of the support members. This distance should be larger than the expected diameter of contaminant particles that may lie on the surface of the chuck. In this manner, the contaminant particles do not adhere to the underside of the wafer during processing.

29 Claims, 2 Drawing Sheets

WAFER SPACING MASK FOR A SUBSTRATE SUPPORT CHUCK AND METHOD OF FABRICATING SAME

BACKGROUND OF THE DISCLOSURE

1. Field of the Invention

The invention relates to a substrate support chuck for supporting a semiconductor wafer within a semiconductor processing system. More particularly, the invention relates to a wafer spacing mask deposited upon the surface of a substrate support chuck for supporting a semiconductor wafer such that the surface of the wafer that faces the chuck is spaced-apart and substantially parallel to the surface of the chuck.

2. Description of the Background Art

Substrate support chucks are widely used to support substrates within semiconductor processing systems. A particular type of chuck used in high-temperature semiconductor processing systems such as high-temperature physical vapor deposition (PVD) is a ceramic electrostatic chuck. These chucks are used to retain semiconductor wafers, or other workpieces, in a stationary position during processing. Such electrostatic chucks contain one or more electrodes imbedded within a ceramic chuck body. The ceramic material is typically aluminum-nitride or alumina doped with a metal oxide such as titanium oxide ($TiO_2$) or some other ceramic material with similar resistive properties. This form of ceramic is partially conductive at high temperatures.

In use, a wafer rests flush against the surface of the chuck body as a chucking voltage is applied to the electrodes. Because of the conductive nature of the ceramic material at high temperatures, the wafer is primarily retained against the ceramic support by the Johnsen-Rahbek effect. Such a chuck is disclosed in U.S. Pat. No. 5,117,121 issued May 26, 1992.

One disadvantage of using a chuck body fabricated from ceramic is that, during manufacture of the support, the ceramic material is "lapped" to produce a relatively smooth surface. Such lapping produces particles that adhere to the surface of the support. These particles are very difficult to completely remove from the surface. Additionally, the lapping process may fracture the surface of the chuck body. Consequently, as the chuck is used, particles are continuously produced by these fractures. Also, during wafer processing, the ceramic material can abrade the wafer oxide from the underside of the wafer resulting in further introduction of particulate contaminants to the process environment. During use of the chuck, the particles can adhere themselves to the underside of the wafer and be carried to other process chambers or cause defects in the circuitry fabricated upon the wafer. It has been found that tens of thousands of contaminant particles may be found on the backside of a given wafer after retention upon a ceramic electrostatic chuck.

Japanese patent application No. 60-261377, published Dec. 24, 1985, discloses a ceramic electrostatic chuck having an embossed support surface. The embossing reduces the surface area of the ceramic support that contacts the wafer. Consequently, the number of contaminant particles transferred to the wafer is reduced. However, such an embossed surface maintains some degree of contact between the ceramic material and the underside of the wafer. Thus, contamination, though reduced, is still substantial.

Similarly, substrate support chucks that are used in low-temperature processing (e.g., less than 300 degrees Celsius) may also produce contaminant particles that interfere with the wafer processing. Such low-temperature chucks include electrostatic chucks and mechanical clamping chucks which contain wafer support surfaces that are typically fabricated from dielectric materials such as alumina. These types of chucks have also been found to produce particular contaminants during use that can adhere to the underside of the wafer during processing.

Therefore, a need exists in the art for apparatus that reduces the amount of contaminant particles that adhere to the underside of the wafer while supported upon a chuck.

SUMMARY OF THE INVENTION

The disadvantages of the prior art are overcome by the present invention of a wafer spacing mask for supporting a wafer, or other workpiece, in a spaced-apart relation to a chuck. More specifically, the invention is a wafer spacing mask containing a plurality of support members deposited upon the support surface of the chuck. The spacing mask is fabricated from a material that is different from the material of the chuck surface. The material of the wafer spacing mask has superior contact properties as compared to the chuck surface material including being less abrasive and more compliant. Such wafer spacing mask fabrication materials include metals such as titanium, titanium-nitride, stainless-steel and the like.

The support members maintain a wafer, or other workpiece, in a spaced apart relation to the support surface of the chuck. The distance between the underside surface of the wafer and the chuck is defined by the thickness of the support members. This distance should be larger than the expected diameter of contaminant particles that may lie on the surface of the chuck. In this manner, the contaminant particles do not adhere to the underside of the wafer during processing. Also, the surface of the support members that do contact the wafer are easily cleaned so that most particles are removed from these surfaces and are trapped in the spaces between the support members.

In a specific embodiment of the invention, the wafer spacing mask is fabricated by depositing, for example, using a physical vapor deposition (PVD) process, metallic support members upon a ceramic chuck. The spacing mask may also be deposited using chemical vapor deposition (CVD), plasma spray deposition, brazing, flame spray deposition, and the like. The support members are deposited in a pre-defined pattern such as a plurality of spaced-apart pads, radial strips, concentric rings, or a combination of radial strips and concentric rings.

As a result of using the invention during processing of semiconductor wafers, the number of particulate contaminants adhered to the underside of a wafer after processing has been reduced from tens of thousands of particles to hundreds of particles. This substantial improvement in particle count has significantly decreased the number of wafers that are found defective during processing. Such improvement has been accomplished without substantial degradation to the wafer clamping force that retains the wafer upon the chuck.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
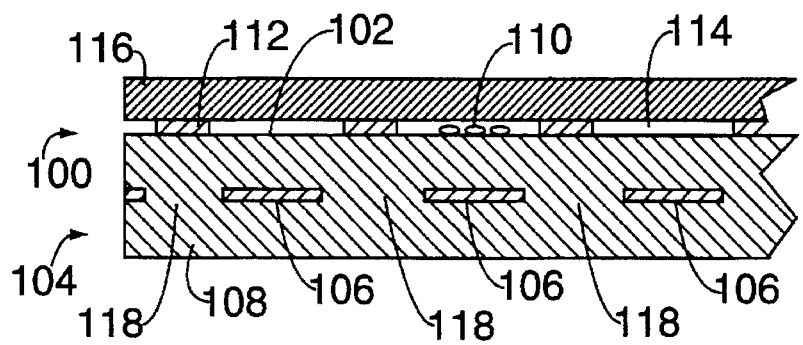
FIG. 1 depicts a vertical cross-sectional view of a ceramic electrostatic chuck containing the wafer spacing mask of the present invention.
Figure 2:
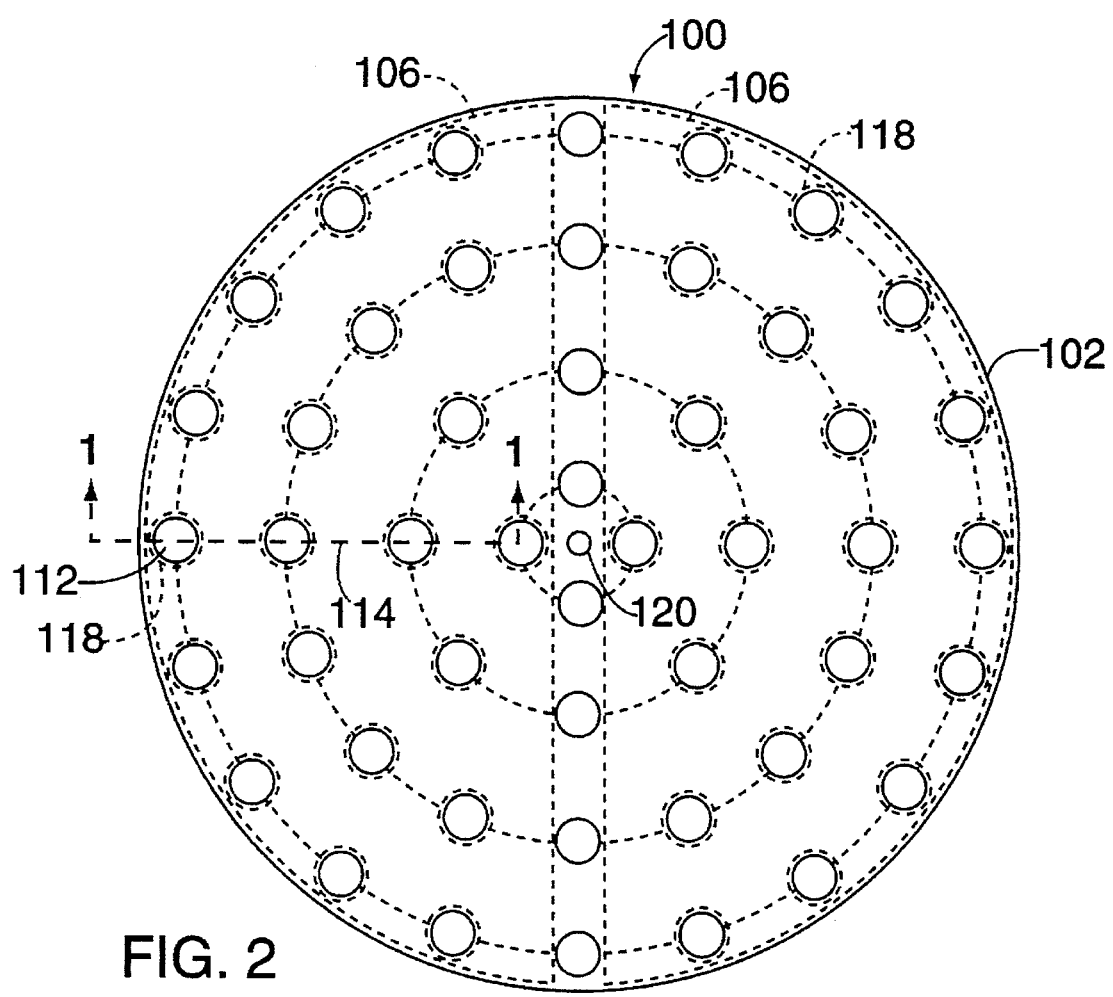
FIG. 2 depicts a top plan view of a pattern for the wafer spacing mask.

FIG. 1 depicts vertical cross-sectional view of a wafer spacing mask 100 positioned atop the support surface 102 of a ceramic electrostatic chuck 104. To illustrate the use of the invention, FIG. 1 depicts the spacing mask 100 supporting a semiconductor wafer 116. FIG. 2 depicts a top plan view of the wafer spacing mask 100 of FIG. 1 (without the wafer 116). For best understanding of the invention, the reader should refer to both FIGS. 1 and 2 while reading the following disclosure.

Although the preferred embodiment of the present invention is discussed as used in conjunction with a ceramic electrostatic chuck, the invention is also useful in supporting substrates above any form of chuck including non-ceramic electrostatic chucks, mechanical clamping chucks, and the like. One important feature of the invention is that the spacing mask be fabricated from a material such as metal that has contact properties that are different from the chuck material such that the material of the chuck surface does not contact the underside of the wafer.

In the preferred embodiment, the electrostatic chuck 104 contains one or more electrodes 106 imbedded within a ceramic chuck body 108. The ceramic chuck body is, for example, fabricated of aluminum-nitride or boron-nitride. Such a partially conductive ceramic material promotes the Johnsen-Rahbek effect during high temperature processing. Other partially conductive ceramics also form useful high temperature chuck materials such as alumina doped with a titanium oxide or a chromium oxide. If the chuck is to be used at low temperatures only, then other ceramic and/or dielectric materials such as alumina are used to form the chuck body. An illustrative ceramic electrostatic chuck is disclosed in commonly assigned U.S. Pat. No. 5,511,799 issued Apr. 30, 1996, herein incorporated by reference. Examples of non-ceramic electrostatic chucks are disclosed in U.S. Pat. No. 4,184,188 issued Jan. 15, 1980 and U.S. Pat. No. 4,384,918 issued May 24, 1983, both of which are incorporated herein by reference.

The wafer spacing mask 100 is deposited upon the support surface 102 of the chuck body 108 typically using a physical vapor deposition (PVD) process. The material may also be deposited by chemical vapor deposition (CVD), plasma spray deposition brazing, flame spray deposition, and the like. The material of the wafer spacing mask has superior contact properties as compared to the surface material of the chuck. For example, the mask material is less abrasive and more compliant (e.g., produces less particles) than the surface material of the chuck. Typically, the material used to form the mask is a metal such as titanium, titanium nitride, stainless steel and the like. Other materials, including conductors, insulators and semiconductors, that have superior contact properties can also used to fabricate the spacing mask.

The spacing mask material is deposited to a pre-defined thickness that maintains the wafer 116, or other workpiece, above the support surface such that particles 110 on the support surface do not contact the wafer surface. An illustrative thickness is approximately 2 microns. The metallic support members are easily cleaned to ensure that any surfaces that contact the wafer 116 are substantially free of contaminants. Importantly, the contaminants tend to become trapped in the spaces 114 between the support members 112.

FIG. 2 depicts an illustrative mask pattern having the support members formed as a plurality of spaced-apart pads 112—112 of deposited material. Each pad 112 has a diameter of approximately 0.25 cm (0.1 inches). The concentric rings (shown as dashed lines) are spaced apart by 0.64 cm (0.25 inches) and the pads within each ring are spaced from one another by approximately 0.64 cm (0.25 inches). Generally speaking, the number, spacing and size of the pads is determined by the amount of clamping force applied by the electrostatic chuck. For example, if the amount of force is large and the pads are spaced relatively distant from one another, the wafer may bow between the pads. On the other hand, placing too many pads on the surface of the chuck could interfere with the electrostatic fields that facilitate the clamping force. Therefore, the pads must be judiciously positioned to optimize support yet limit their interference with the clamping force.

Since the ceramic chuck becomes semiconducting at high temperatures (e.g., 300° C. degrees or more), conductive pads should not be positioned over the electrodes. To produce the Johnsen-Rahbek effect that generates the clamping force, current must be conducted from the wafer to the ceramic chuck. However, these currents must be maintained at a relatively low level to avoid damaging the wafer. As such, the pads are generally positioned between electrode locations to avoid lying within the highest electrostatic fields and causing substantial amounts of current to flow through the wafer at the mask-to-wafer contact point. In the embodiment of the invention depicted in FIGS. 1 and 2, the electrode structure (e.g. two "half-moon" shaped electrodes) contains holes 118 that are concentrically aligned with the spacing mask pads 112. The diameter of each hole 118 is slightly larger (e.g., by approximately 0.25 cm (0.1 inch)) than the diameter of a corresponding pad 112. Additionally, minimizing the size of the area of contact between the mask and the wafer also aids in reducing current flow through the wafer.

On the other hand, at low temperatures (e.g., less than 300° C. degrees) the ceramic chuck conducts less current and, for these applications of the invention, the support members can be positioned anywhere on the chuck support surface. Furthermore, for applications of the spacing mask on dielectric chucks or mechanical clamping chucks, the positioning of the support members relative to the electrodes (if any) is generally irrelevant. To ensure adequate and uniform support of the wafer above the chuck, the support members should be evenly distributed over the entire surface of the chuck that, absent the spacing mask, would contact the underside of the wafer.

To facilitate heat transfer from the wafer to the chuck body, a heat transfer medium, e.g., a gas such as helium, is pumped into the space 114 between the backside surface of the wafer 116 and the support surface of the chuck body 108. This cooling technique is known as "backside cooling". The heat transfer medium is provided via a port 120 that is formed through the chuck body 108. The medium is typically supplied to the underside of the wafer at a rate of 2–30 sccm. The medium generally flows from the port 120 outward toward the edge of the wafer and escapes into the reaction chamber environment. Such backside cooling is well-known in the art and is disclosed, for example, in commonly assigned U.S. Pat. No. 5,228,501, issued to Tepman et al. on Jul. 20, 1993. Importantly, when backside cooling is used, the wafer spacing mask pattern has a dual purpose: (1) to support the wafer to reduce backside particle adherence and (2) to create heat transfer medium distribution channels upon the support surface of the chuck. However, additional heat transfer medium distribution channels (not shown) may be formed in the surface of the chuck body to further aid distribution of the heat transfer medium across the underside of the wafer.

Figure 3:
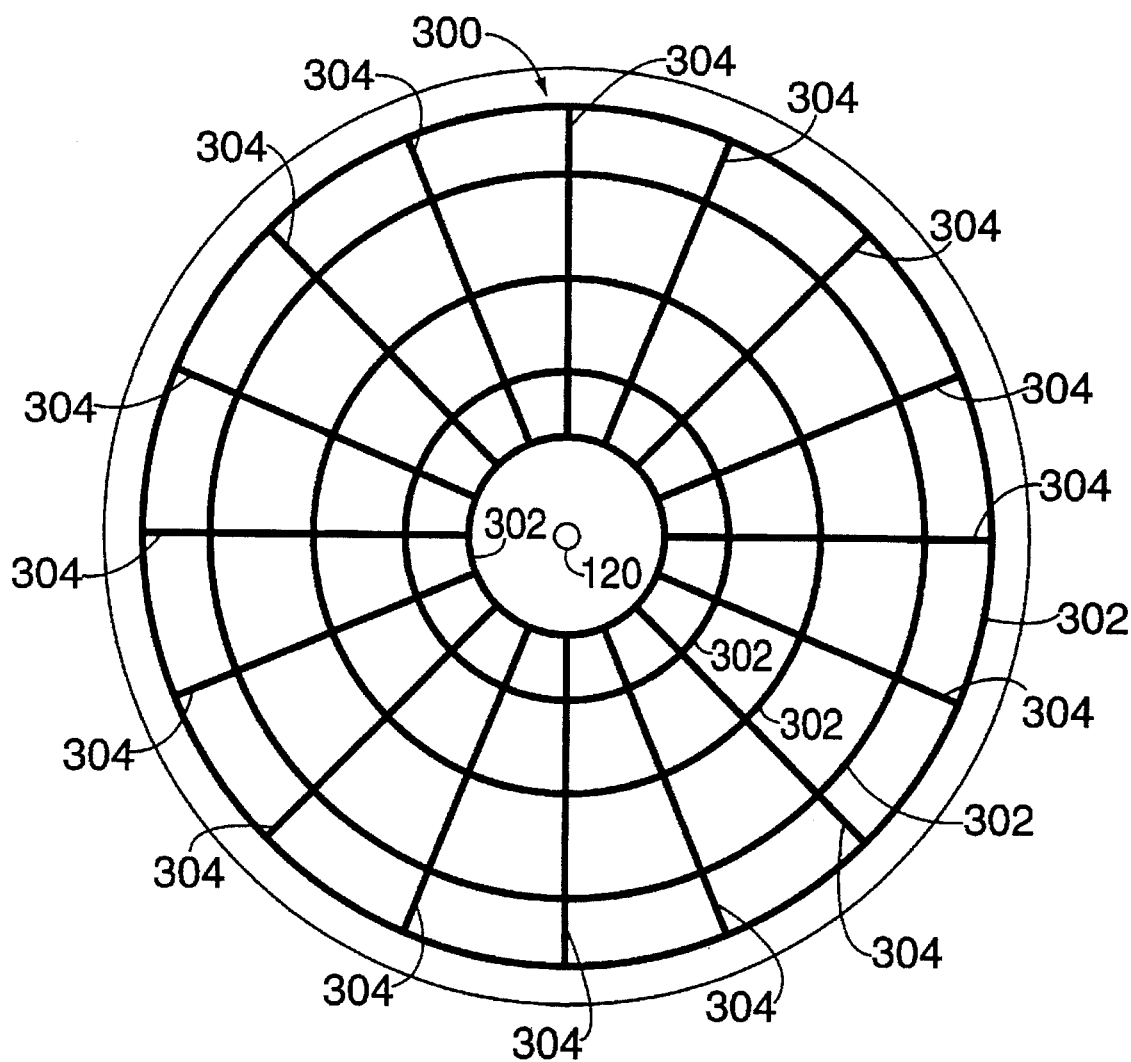
FIG. 3 depicts top plan view of an alternative pattern for the wafer spacing mask.

FIG. 3 depicts an alternative mask layout 300 where the mask contains a plurality of concentric rings 302 as well as radially extending strips 304 that interconnect the rings. The rings, for example, are spaced from one another by approximately 0.64 cm (0.25 inches). Alternatively, the rings or the radial strips could be used separately as the spacing mask.

The material for this embodiment is also deposited using a PVD process or some other deposition technique appropriate for depositing the mask material.

Other mask patterns may be used. The key feature of the invention is that the wafer is supported in a spaced-apart relation to the surface of the chuck by a spacing mask. The particular mask pattern and mask material is defined by the particular application for the chuck including such factors as chucking voltage, chucking force, wafer thickness, the chuck electrode pattern, the particular process that the wafer is to be subjected and the like.

Using the spacing mask in conjunction with a ceramic chuck has resulted in substantially decreased particulate contamination of wafers. Empirical data shows that a conventional ceramic chuck supporting a wafer directly upon its support surface can transfer tens of thousands of particles to the underside of a wafer. However, using the spacing mask of the present invention reduces the particle count for particles located on the underside of a wafer to hundreds of particles. Importantly, the spacing mask does not significantly interfere with the clamping process or impact the clamping force that retains the wafer upon the chuck.

Although various embodiments which incorporate the teachings of the present invention have been shown and described in detail herein, those skilled in the art can readily devise many other varied embodiments that still incorporate these teachings.

What is claimed is:

1. Apparatus for supporting a workpiece in a spaced-apart relation to a support surface of a workpiece support chuck, comprising:

a spacing mask, deposited upon said support surface of said workpiece support chuck, for supporting said workpiece in a spaced-apart relation to said support surface, where said spacing mask is fabricated of a metallic material.

2. The apparatus of claim 1 wherein said metallic material is a titanium, titanium-nitride or stainless steel.

3. The apparatus of claim 1 wherein said support surface is fabricated of a ceramic material.

4. The apparatus of claim 3 wherein said ceramic material is partially conductive at temperatures above approximately 300 degrees Celsius.

5. The apparatus of claim 4 wherein said ceramic material is aluminum-nitride, boron-nitride, or alumina doped with a conductive oxide.

6. The apparatus of claim 1 wherein said support surface is fabricated of a dielectric material.

7. The apparatus of claim 1 wherein said workpiece support chuck is an electrostatic chuck.

8. The apparatus of claim 1 wherein said spacing mask comprises support members forming a pattern.

9. The apparatus of claim 8 wherein said workpiece support chuck is an electrostatic chuck containing a plurality of electrodes embedded beneath said support surface and said support members are formed in said pattern upon the support surface and between said plurality of electrodes, whereby said support members do not overlap said plurality of electrodes.

10. The apparatus of claim 8 wherein said pattern comprises a plurality of pads.

11. The apparatus of claim 8 wherein said pattern comprises a plurality of radial support strips and a plurality of concentric rings.

12. Apparatus for supporting a workpiece in a spaced-apart relation to a support surface of a ceramic electrostatic chuck comprising:

a spacing mask, deposited upon said support surface of said ceramic electrostatic chuck, for supporting said workpiece in a spaced-apart relation to said support surface, where said spacing mask is fabricated of a metallic material.

13. The apparatus of claim 12 wherein said metallic material is a titanium, titanium-nitride or stainless steel.

14. The apparatus of claim 12 wherein a support surface of the ceramic electrostatic chuck is partially conductive at temperatures above approximately 300 degrees Celsius.

15. The apparatus of claim 12 wherein a support surface of said ceramic electrostatic chuck is fabricated of aluminum-nitride, boron-nitride, or alumina doped with a conductive oxide.

16. The apparatus of claim 12 wherein said spacing mask comprises a support member forming a pattern.

17. The apparatus of claim 16 wherein said ceramic electrostatic chuck containing a plurality of electrodes embedded beneath said support surface and said support members are formed in said pattern upon the support surface and between said plurality of electrodes, whereby said support members do not overlap said plurality of electrodes.

18. The apparatus of claim 16 wherein said pattern comprises a plurality of pads.

19. The apparatus of claim 16 wherein said pattern comprises a plurality of radial support strips and a plurality of concentric rings.

20. A method of fabricating a wafer spacing mask comprising the steps of:

providing a workpiece support chuck having a support member;

depositing a metallic material in a pre-defined pattern over a support surface of said support member to form said wafer spacing mask.

21. The method of claim 20 wherein said depositing step comprises the step of using a physical vapor deposition process to deposit the metallic material.

22. The method of claim 20 wherein said metallic material is a titanium, titanium-nitride or stainless steel.

23. The method of claim 20 wherein said support member is fabricated of a ceramic material.

24. The method of claim 23 wherein said ceramic material is partially conductive at temperatures above approximately 300 degrees Celsius.

25. The method of claim 23 wherein said ceramic material is aluminum-nitride, boron-nitride, or alumina doped with a conductive oxide.

26. The method of claim 20 wherein said support member is fabricated of a dielectric material.

27. The method of claim 20 wherein said pre-defined pattern comprises a plurality of pads.

28. The method of claim 20 wherein said pre-defined pattern comprises a plurality of radial support strips and a plurality of concentric rings.

29. The method of claim 20 wherein said workpiece support chuck is an electrostatic chuck containing a plurality of electrodes embedded beneath said support surface and said metallic material is deposited in said pre-defined pattern upon the support surface and between said plurality of electrodes, whereby said wafer spacing mask does not overlap said plurality of electrodes.

* * * * *